United States Patent
Kubby et al.

(10) Patent No.: US 6,177,800 B1
(45) Date of Patent: Jan. 23, 2001

(54) METHOD AND APPARATUS FOR USING SHUTTERED WINDOWS IN A MICRO-ELECTRO-MECHANICAL SYSTEM

(75) Inventors: Joel A. Kubby, Rochester, NY (US); Eric Peeters, Fremont, CA (US); R. Enrique Viturro; Fred F. Hubble, III, both of Rochester, NY (US); Stanley J. Wallace, Victor, NY (US); Alan J. Werner, Jr., Rochester, NY (US)

(73) Assignee: Xerox Corporation, Stamford, CT (US)

(*) Notice: Under 35 U.S.C. 154(b), the term of this patent shall be extended for 0 days.

(21) Appl. No.: 09/200,353

(22) Filed: Nov. 10, 1998

(51) Int. Cl.[7] .................. G01R 29/12; G01L 21/30; H01G 5/14
(52) U.S. Cl. .................. 324/458; 324/660; 361/296
(58) Field of Search .................. 324/458, 72, 457, 324/455, 109, 660, 686, 690; 361/296, 277, 278, 280, 287, 292, 289

(56) References Cited

U.S. PATENT DOCUMENTS

| | | | |
|---|---|---|---|
| 4,030,347 | 6/1977 | Norris et al. | 73/769 |
| 4,835,461 | 5/1989 | Snelling | 324/109 |
| 5,025,346 | 6/1991 | Tang et al. | 361/283.1 |
| 5,489,850 * | 2/1996 | Werner, Jr. et al. | 324/458 |
| 5,496,436 | 3/1996 | Bernstein et al. | 438/50 |
| 5,517,123 * | 5/1996 | Zhao et al. | 324/458 |

* cited by examiner

Primary Examiner—Safet Metjahic
Assistant Examiner—James Kerveros
(74) Attorney, Agent, or Firm—Fay, Sharpe, Fagan, Minnich & McKee, LLP

(57) ABSTRACT

A windowed shutter on a micro-electro-mechanical system improves output current of a non-contacting electrostatic voltmeter. The output current is increased by increasing the area modulated by the micro-electro-mechanical shutter system and by increasing the speed of that modulation. The increase in the area modulated by the windowed shutter is in direct proportion to the number of windows used. Moreover, the speed of the modulation is increased by increasing the resonant frequency of the system. Less shutter mass increases the frequency thus increasing shutter movement over time.

14 Claims, 2 Drawing Sheets

METHOD AND APPARATUS FOR USING SHUTTERED WINDOWS IN A MICRO-ELECTRO-MECHANICAL SYSTEM

BACKGROUND OF THE INVENTION

1. Field of the Invention

The invention pertains to the art of micro-electro-mechanical modulation systems and, more articularly to electrostatic voltmeters.

2. Description of Related Art

In an effort to achieve reliable, low cost, and potentially high precision micro sensors, development continues in the technology of integrating small mechanical elements onto silicon substrates. Polysilicon microbridges have been driven vertically and laterally as resonant microsensors. With respect to laterally driven microbridges, short displacements of a comb type drive of the type shown and described in U.S. Pat. No. 5,025,346, typically on the order of one to ten micrometers, lead to very weak sensed signals. The disclosure of the U.S. Pat. No. 5,025,346 patent is incorporated herein by reference.

One such class of devices hampered by the weak output signals is electrostatic voltmeters (ESV's). Non-contacting ESV's are utilized, for example, within xerographic printers to measure the surface voltage of the photoreceptor; however, additional applications are known in the art. In almost all non-contacting voltmeters the measurement of the surface voltage is made using capacitive coupling of a sense probe to the measured surface. This capacitive coupling is typically modulated by a mechanical shutter between the sense probe and the measured surface. The output current of a capacitively coupled sense probe is given by:

$$i_s(t)=dQ(t)/dt=d/dt[C(t)]V_s(t)]=C(t)dV_s(t)/dt+V_s dC(t)/dt, \quad \text{EQ.1}$$

where Q(t) is the time-varying charge induced on the sense probe, C(t) is the time-varying capacitance and $V_s(t)$ is the time-varying measured surface voltage. For the measurement of the d.c. component of the photoreceptor voltage, $V_{dc}$, the equation can be simplified to:

$$i_s(t)=V_{dc}dC(t)/dt=V_{dc}[\partial C(x,t)/\partial x][\partial x/\partial t], \quad \text{EQ.2}$$

where the shutter position determines C(t) at any time. For a sinusoidal drive signal the capacitance is given by:

$$C(t)=C_o+C_m \sin(\omega t). \quad \text{EQ.3}$$

Here $C_O$, is the d.c. component of the capacitance that does not change with time and $C_m$ is the a.c. component of the capacitance that changes with the shutter motion. To maximize the signal, either the change in the capacitance with respect to shutter position (i.e. $\partial C(x,t)/\partial x$, from EQ. 2) or the shutter velocity (i.e. $\partial x/\partial t$, from EQ. 2), or both, can be increased.

Since, the shutter is typically operated at resonance, the resonant frequency determines the shutter velocity, $\partial x/\partial t$. On the other hand, shutter geometry determines the change in capacitance with respect to shutter position. Previous micro-electro-mechanical ESV's employ a simple shutter that masks a portion of the sense probe. The shutter is actuated by an electrostatic comb type drive, which typically has a maximum displacement, $\delta x$, on the order of 1–10 $\mu$m.

In such a design the modulated change in the capacitance is determined by the permittivity of freespace $\epsilon_o$, and the area A:

$$C(t)=C_o+(\epsilon_o \delta A/d)\sin(\omega t)=C_o+(\epsilon_o \lambda \delta x/d)\sin(\omega t), \quad \text{EQ.4}$$

where $\delta x$ is the displacement of the shutter, and $\lambda$ is the length of the shutter, for a spacing d between the sense probe and the photoreceptor. $\delta_x$ is limited by the displacement of the comb drive. Thus, to increase the modulated area the length of the shutter, $\lambda$, can be increased. However, increasing the length of the shutter, $\lambda$, will correspondingly increase the size and mass of the resonator, leading to a decrease in sensor spatial resolution and a lower mechanical resonant frequency. This has the undesirable effect of reducing sense probe current output.

Thus, an alternative solution has been sought that provides a larger effective modulation area in order to obtain a stronger signal than previous designs.

SUMMARY OF THE INVENTION

The present invention contemplates a new and improved apparatus which overcomes all of the above-referenced problems and others, providing a higher output current.

In accordance with the present invention there is provided an electrostatic voltmeter which includes a sense probe assembly having a plurality of sense probes for measuring voltage by capacitive coupling. A shutter having a plurality of windows is also included and is moveable between a first position where the sense probe assembly is exposed and a second position where the sense probe assembly is covered. The shutter is located adjacent to the sense probe assembly. Additionally, a shutter modulator is operatively associated with the shutter and is capable of selectively moving the shutter between the first position and the second position.

According to another aspect of the present invention, the shutter modulator includes a micro-electro-mechanical system which contains an electrostatic comb drive. The comb drive defines a maximum displacement along an axis parallel to the comb fingers. The windows in the shutter further define a width equivalent to that of the maximum displacement of the comb drive.

In accordance with still another aspect of the present invention, a method of increasing an output signal produced by a non-contacting voltmeter is provided. A moveable shutter is placed adjacent to a plurality of sensed probes. The moveable shutter has a plurality of windows spaced therein to expose the sense probes in a first position and to cover the sense probes in a second position. The shutter is then moved between the first and second positions thereby increasing the output signal produced.

In accordance with yet another aspect of the present invention, a method additionally includes capacitively coupling the sense probes to a surface to be measured. Based on the capacitive coupling an output signal is then produced.

In accordance with still another aspect of the present invention, a MEMS modulator assembly for modulating a preselected condition includes a first surface and a second surface spaced from the first surface. The second surface is in selective operative communication with the first surface via the preselected condition. Further included is a shutter including spaced first and second windows disposed between the first and second surfaces. The shutter is movable between a first position where the first surface is masked relative to the second surface and a second position where the first surface operatively communicates with the second surface.

In accordance with a different aspect of the present invention, the preselected condition is modulating light emitted or directed from the first surface.

A principal advantage of the present invention is an increased output signal from the sense probes. The increased signal results from a larger modulated area as provided by multiple windows.

Another advantage of the invention resides in the windows physically lightening the shutter and allowing it to resonate at an increased frequency.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts. The invention may also take form and certain steps and arrangements of steps, a preferred embodiment of which will be described in detail here and illustrated in the accompanying drawings which form a part hereof and wherein.

DETAILED DESCRIPTION OF THE PREFERRED EMBODIMENT

Figure 1:
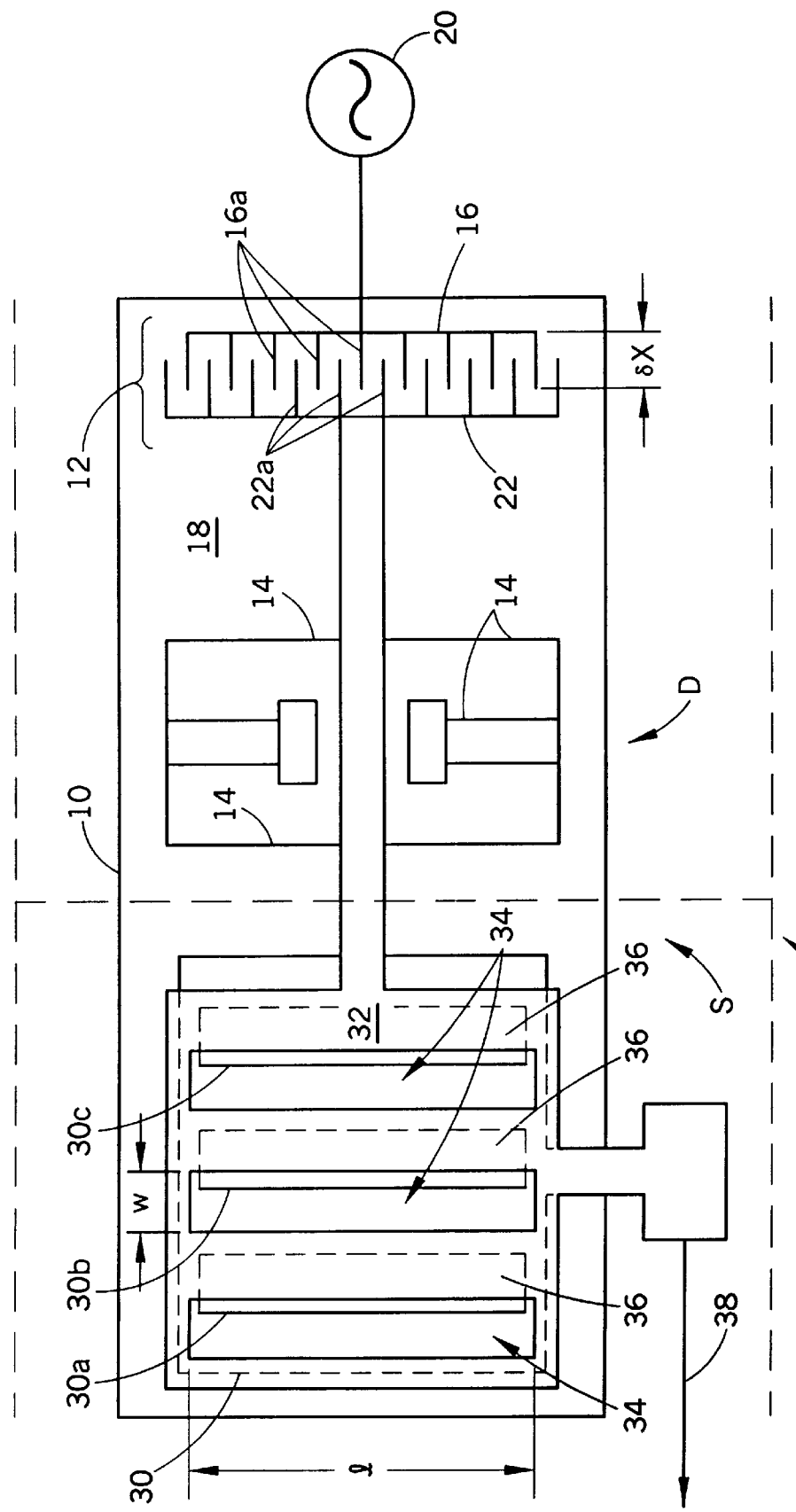
FIG. 1 is a depiction of an electrostatic voltmeter according to the present invention.

Referring now to the drawings wherein the showings are for the purpose of illustrating the preferred embodiment of the invention only and not for purposes of limiting same, the FIGURES show a voltmeter V that satisfactorily conforms to the invention. The voltmeter V generally includes a driver component D and a sensor component S. More specifically, and with particular reference to FIG. 1, a microstructure 10 has a driver component D configured as a comb drive 12 with a cantilevered spring arrangement 14. The comb drive 12 is a common mechanism for electrostatically driving microstructures and includes a fixed side 16 attached to a substrate 18. The comb drive is electrically connected to an electrostatic drive signal source 20. A movable side 22 of the comb drive is held to, but above, the substrate 18 by the cantilevered spring arrangement 14. A plurality of comb "fingers" 16a, 22a are interdigitated to provide electrical communication between the fixed side 16 and the movable side 22. The length of these fingers define a maximum potential displacement, $\delta x$.

The driver component D shown is FIG. 1 is understood to be merely a representative structure that would fulfill the objects of the present invention. However, other driver components are also encompassed by this disclosure such as magnetostatically and thermally driven microstructures among others.

Operatively associated or connected to the driver component D is the sensor component S. In this preferred embodiment, the driver component D is disposed opposite or linearly adjacent the sensor component, although it will be appreciated that other geometric arrangements may be used without departing from the scope and intent of the subject invention. A sense probe assembly 30 is fixed to the substrate 18 and is capable of capacitive coupling with a surface to be measured. The sense probe assembly is a set of spaced individual sense probes (represented here by numerals 30a, 30b, 30c, etc.) The individual sense probes are connected together so that individual signals are combined. The sensor component S further comprises a movable shutter 32 that selectively overlays the sense probe assembly 30. Here, the shutter is mechanically connected to driver component D so that linear displacement of the driver component results in a corresponding displacement of the shutter. The shutter 32 has a plurality or set of openings or windows 34 configured such that the sense probe assembly 30 is selectively exposed through the windows 34 when the shutter 32 is in a first position. The individual shutter openings are spaced from one another by a dimension matching the individual sense probe spacing. When the shutter 32 is in a second position, the sense probe assembly 30, or individual sense probes, is/are covered by the shutter regions 36 interposed between the windows. In other words, when the shutter 32 is in the first position, capacitive coupling by the sense probe assembly 30 is permitted. On the other hand, when the shutter is in the second position capacitive coupling by the sense probe assembly is masked or inhibited. The current generated by the sense probe assembly 30 is output on line 38.

The windows 34 define a length l and a width w. In a presently preferred embodiment, the width V is on the order of 10 $\mu$m and is slightly less than the maximum potential displacement $\delta x$. Similarly, each shutter region 36 separating the windows is substantially equal to the maximum potential displacement $\delta x$.

One skilled in the art can now appreciate that this change in geometry has the desirable effect of using a small drive displacement, $\delta_x$, to advantageously provide a greater change in the modulated area. Said another way, the modulated area is $(n)(\delta_x)(\lambda)$, or n times as large as the shutter without windows (where n is the number of windows 34 in the shutter 32). For ease of reference, a modification of Equation 4 is shown here so that the benefit of increased area may be appreciated mathematically:

$$C(t)=C_o+\epsilon_o\delta A/d \; \sin(\omega t)=C_o+\epsilon_o n\lambda\delta x/d \; \sin(\omega t), \qquad \text{EQ.4'}$$

This increased area desirably increases the output signal.

The windows in the shutter 32 also contribute to increase the output signal. The windows make the shutter lighter, i.e., decreased weight, thus increasing the resonant frequency of the sense probe system. It follows that increased frequency ($\omega$) yields increased shutter velocity ($\partial x/\partial t$) as shown by the following equations:

$$x=x_o \sin(\omega t), \qquad \text{EQ.5}$$

thus, $$\partial x/\partial t=\omega x_o \cos(\omega t), \qquad \text{EQ.6}$$

and $$i_s(t)=V_{dc}dC(t)/dt=V_{dc}[\partial C(x,t)/\partial x \;][\partial x/\partial t], \qquad \text{EQ.2}$$

Therefore, increased velocity in turn yields an increased output signal.

Figure 2:
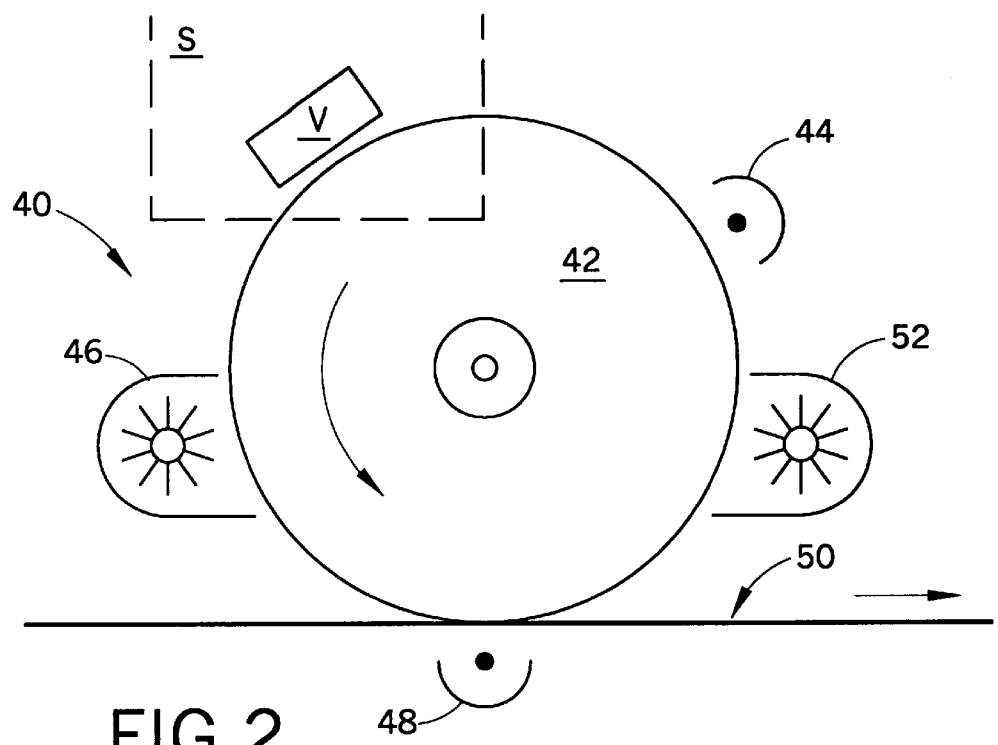
FIG. 2 is a schematic view of an electrostatic copier/printer incorporating the electrostatic voltmeter.

Referring now to FIG. 2, a xerographic type copier/printer 40 includes a photoreceptor 42 configured as a rotating drum. The present invention recognizes that other photoreceptor configurations, such as belts or webs are possible. A charge station 44 is provided where photoreceptor 42 is charged in preparation for imaging. During any of various operations (copying, printing, etc.), the photoreceptor 42 travels a path adjacent the voltmeter V after which an electrostatic image is placed on the photoreceptor 42. Next, the photoreceptor 42 proceeds to a developer station 46 where the latent image created on the photoreceptor 42 is developed followed by a transfer station 48 where the previously developed image is transferred to a copy sheet 50. Residual developer materials are removed from the photoreceptor 42 at cleaning station 52 prior to charging again at the charge station 44. Details of the xerographic device and method of operation are generally known to those of ordinary skill in the art and the particular details form no part of the present invention.

Figure 3:
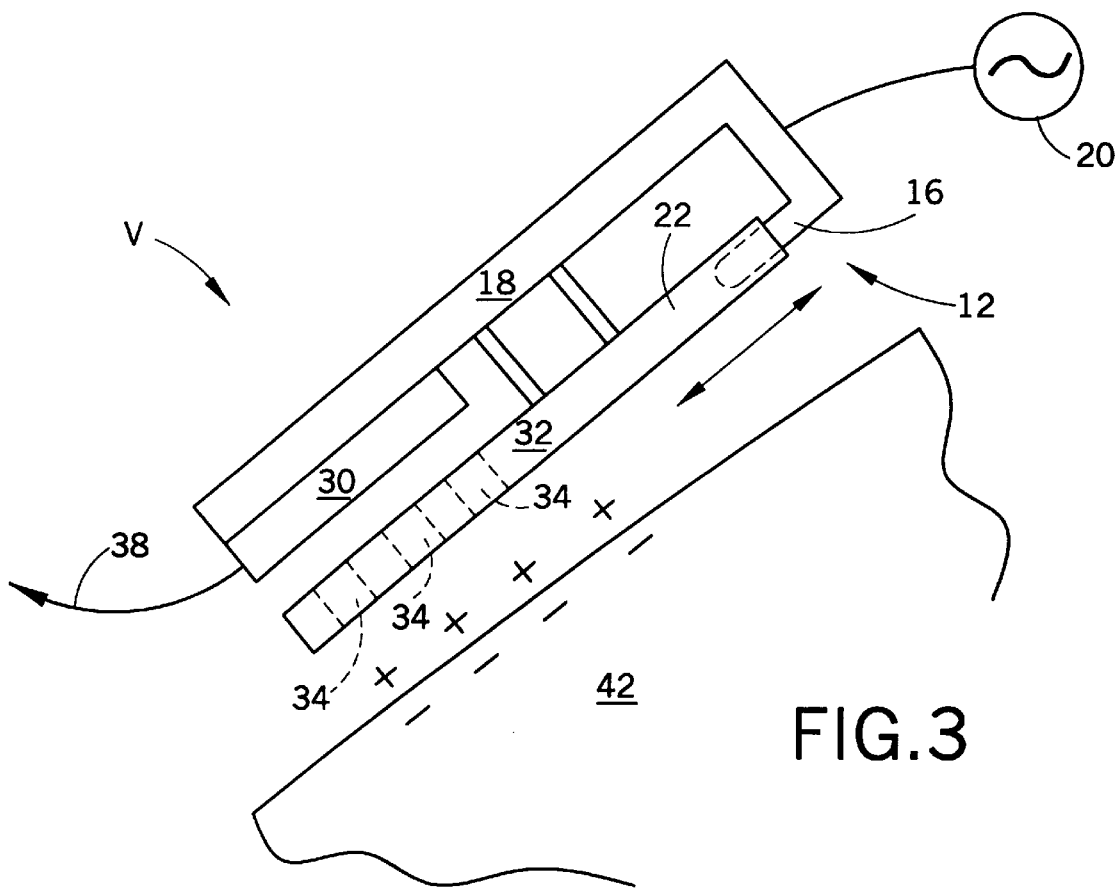
FIG. 3 is a detail of the voltmeter from FIG. 2.

FIG. 3 shows a cross-section of the voltmeter V in the copier/printer 40 as described above. Cross-referencing FIG. 1, the voltmeter V contains a comb drive 12 with a fixed side 16 attached to a substrate 18 and a movable side 22 movably attached to the substrate via a cantilevered spring arrangement 14. The sense probe assembly 30 is shown attached to the substrate 18 with the movable shutter 32 between the substrate and the photoreceptor 42.

FIGS. 2 and 3 are merely one representative example of the use of the present invention in a practical environment. The general principles, though, may be applied to related environments or applications. For example, flat panel display applications can incorporate the principle of the modulating light between first and second surfaces. Likewise, the preferred embodiment employed a single MEMS modulator in the electrostatic voltmeter application. However, one skilled in the art will readily appreciate the application of these principles to an array of modulators. For example, in an effort to sense and control page width, an array of modulators can be used to sense photoreceptor voltage at discrete locations. Moreover, although the displacement described with reference to the preferred embodiment of FIGS. 1–3 is linear, embodiments using angular displacements are also contemplated and deemed to fall within the scope hereof.

The invention has been described with reference to the preferred embodiment. Modifications and alterations will occur to others upon a reading and understanding of this specification. We intend to include all such modifications and alterations insofar as they come within the scope of the appended claims or the equivalents thereof.

Having thus described the invention, we claim:

1. An electrostatic voltmeter comprising:

a sense probe assembly for measuring a voltage by capacitive coupling;

a shutter defining a plurality of windows movable between a first position where the sense probe assembly is exposed and a second position where the sense probe assembly is covered, the shutter being adjacent to the sense probe assembly; and a shutter driver operatively associated with the shutter for selectively moving the shutter between the first position and the second position.

2. The electrostatic voltmeter of claim 1 where the shutter driver comprises:

a micro-electro-mechanical system having an electrostatic comb drive defining a maximum displacement ($\delta x$) along an axis parallel to the comb fingers.

3. The electrostatic voltmeter of claim 2 where each of the plurality of windows defines a length (l) perpendicular to the comb fingers and a width (w) parallel to the comb fingers, the width being equal to the maximum displacement.

4. The electrostatic voltmeter of claim 3 where the shutter driver modulates the shutter at a resonant frequency of the voltmeter.

5. A method to increase an output signal produced by a non-contacting voltmeter comprising:

providing a plurality of sense probes;

placing a movable shutter adjacent to the sense probes, the shutter defining a plurality of windows spaced to expose the sense probes in a first position, and cover the sense probes in a second position; and moving the shutter between the first position and the second position.

6. The method of claim 5 wherein the providing step further comprises:

capacitively coupling to a surface to be measured; and producing the output signal based on the coupling step.

7. The method of claim 6 wherein the moving step comprises:

attaching the shutter to a micro-electro-mechanical system actuated by a comb type drive; and applying an electrostatic drive signal to the comb type drive.

8. The method of claim 7 wherein the comb type drive defines a maximum displacement ($\delta x$) and the plurality of windows each define a width equal to the maximum displacement.

9. In a voltmeter where a shutter is used to alternatingly cover and uncover a first detector defining a modulated area thereby producing a current proportional to the modulated area the improvement comprising:

a plurality of additional detectors connected to and adjacent to the first detector and spaced along the path of shutter movement; and a plurality of windows in the shutter, the windows distanced from each other such that the windows uncover and cover the first and the additional detectors simultaneously.

10. The improved voltmeter of claim 9 where the shutter motion defines a maximum displacement ($\delta x$) and the windows define a width substantially equal to the maximum displacement.

11. A MEMS modulator assembly for modulating a preselected condition comprising:

a first surface;

a second surface spaced from the first surface and in selective operative communication with the first surface via the preselected condition; and, a shutter including spaced first and second windows disposed between the first and second surfaces and movable between a first position where the surface operatively communicates with the second surface and a second position where the first surface is masked relative to the second surface.

12. The MEMS modulator of claim 11 wherein the first and second windows have a dimension measured in the direction of shutter movement substantially identical to the maximum extent of shutter movement.

13. The MEMS modulator of claim 11 wherein the first and second windows are spaced from one another a dimension substantially identical to the extent of shutter movement.

14. The MEMS modulator of claim 11 wherein the preselected condition is modulating light emitted or directed from the first surface.

* * * * *